United States Patent
Saito et al.

(10) Patent No.: US 10,505,536 B2
(45) Date of Patent: Dec. 10, 2019

(54) GATE DRIVING CIRCUIT

(71) Applicant: Mitsubishi Electric Corporation, Tokyo (JP)

(72) Inventors: Shota Saito, Fukuoka (JP); Keisuke Nakamoto, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/317,691

(22) PCT Filed: Nov. 29, 2016

(86) PCT No.: PCT/JP2016/085424
§ 371 (c)(1),
(2) Date: Jan. 14, 2019

(87) PCT Pub. No.: WO2018/100647
PCT Pub. Date: Jun. 7, 2018

(65) Prior Publication Data
US 2019/0273492 A1    Sep. 5, 2019

(51) Int. Cl.
*H03K 17/042* (2006.01)
*H03K 17/082* (2006.01)
(Continued)

(52) U.S. Cl.
CPC ....... *H03K 17/567* (2013.01); *H03K 17/6871* (2013.01)

(58) Field of Classification Search
CPC combination set(s) only.
See application file for complete search history.

(56) References Cited

U.S. PATENT DOCUMENTS 9,172,365 B2 * 10/2015 Kandah .............. H03K 17/0822
9,356,515 B2 *  5/2016 Sicard ................. H03K 17/687
(Continued)

FOREIGN PATENT DOCUMENTS

JP    2004-187360 A    7/2004
JP    2012-213294 A    11/2012
(Continued)

OTHER PUBLICATIONS

International Search Report; Written Opinion; and Notification of Transmittal of the International Search Report and the Written Opinion of the International Searching Authority, or the Declaration issued in PCT/JP2016/085424; dated Feb. 21, 2017.

*Primary Examiner* — An T Luu
(74) *Attorney, Agent, or Firm* — Studebaker & Brackett PC

(57) ABSTRACT

A plurality of gate driver units (3,4) respectively drives a plurality of semiconductor switching devices (SW1,SW2) connected in parallel. A control circuit (5) controls the plurality of gate driver units (3,4). Each gate driver unit (3,4) includes a gate driver (6) supplying a gate voltage to a gate of the corresponding semiconductor switching device (SW1, SW2), and a potential difference measuring unit (7) measuring a potential difference (Va) arising due to wiring inductance on an emitter side of the corresponding semiconductor switching device (SW1,SW2) for each cycle of an output frequency. The control circuit (5) adjusts the gate voltage (VGE) supplied by the gate driver (6) of each gate driver unit (3,4) such that the potential differences (Va) of the plurality of semiconductor switching devices (SW1, SW2) in turn-on or turn-off switching operation become same as each other.

12 Claims, 3 Drawing Sheets

(51) Int. Cl.
  *H02M 3/15*  (2006.01)
  *H02M 1/08*  (2006.01)
  *H03K 17/567*  (2006.01)
  *H03K 17/687*  (2006.01)

(56) References Cited

U.S. PATENT DOCUMENTS

| | | | |
|---|---|---|---|
| 9,882,465 B2 * | 1/2018 | Pronovost | ............ H03K 17/166 |
| 9,929,647 B1 * | 3/2018 | Jeong | .................... H02M 3/156 |
| 2015/0061750 A1 | 3/2015 | Kandah et al. | |

FOREIGN PATENT DOCUMENTS

| | | |
|---|---|---|
| JP | 2012-249224 A | 12/2012 |
| JP | 2015-050925 A | 3/2015 |

\* cited by examiner

GATE DRIVING CIRCUIT

FIELD

The present invention relates to a gate driving circuit respectively driving a plurality of semiconductor switching devices connected in parallel.

BACKGROUND

Semiconductor switching devices are used for inverter control in railways or in electric power transmission. When a plurality of semiconductor switching devices connected in parallel are operated, current imbalance arises due to dispersion in characteristics between the devices.

FIG. 4 is a diagram illustrating turn-on switching waveforms of two semiconductor switching devices connected in parallel. FIG. 5 is a diagram illustrating turn-off switching waveforms of two semiconductor switching devices connected in parallel. I1 and I2 denote currents flowing through the two semiconductor switching devices, VGE denotes a gate-emitter voltage, and VCE denotes a collector-emitter voltage. It is apparent from FIGS. 4 and 5 that imbalance arises between the currents I1 and I2.

CITATION LIST

Patent Literature

[PTL 1] JP 2012-249224 A

SUMMARY

Technical Problem

There has been a problem that losses arising in the individual semiconductor switching devices disperse in occurrence of such current imbalance. Moreover, there is proposed a technology to detect collector-emitter voltages VCE of a plurality of semiconductor switching devices connected in parallel and to adjust timings of gate signals (for example, see PTL 1). However, since the collector-emitter voltages VCE are theoretically identical to one another, dispersion of di/dt has not been able to be accurately monitored.

The present invention is devised in order to solve the aforementioned problems, and an object thereof is to obtain a gate driving circuit capable of suppressing dispersion of switching losses.

Solution to Problem

A gate driving circuit according to the present invention includes: a plurality of gate driver units respectively driving a plurality of semiconductor switching devices connected in parallel; and a control circuit controlling the plurality of gate driver units, wherein each gate driver unit includes a gate driver supplying a gate voltage to a gate of the corresponding semiconductor switching device, and a potential difference measuring unit measuring a potential difference arising due to wiring inductance on an emitter side of the corresponding semiconductor switching device for each cycle of an output frequency, and the control circuit adjusts the gate voltage supplied by the gate driver of each gate driver unit such that the potential differences of the plurality of semiconductor switching devices in turn-on or turn-off switching operation become same as each other.

Advantageous Effects of Invention

The present invention adjusts a gate voltage supplied by the gate driver of each gate driver unit such that the potential differences arising due to wiring inductances on emitter sides of the plurality of semiconductor switching devices in turn-on or turn-off switching operation become same as each other. Thereby, since di/dt of the semiconductor switching devices can be matched to one another, current imbalance in parallel connection operation can be suppressed, and dispersion of switching losses can be suppressed.

DESCRIPTION OF EMBODIMENTS

A gate driving circuit according to the embodiments of the present invention will be described with reference to the drawings. The same components will be denoted by the same symbols, and the repeated description thereof may be omitted.

Embodiment 1

Figure 1:
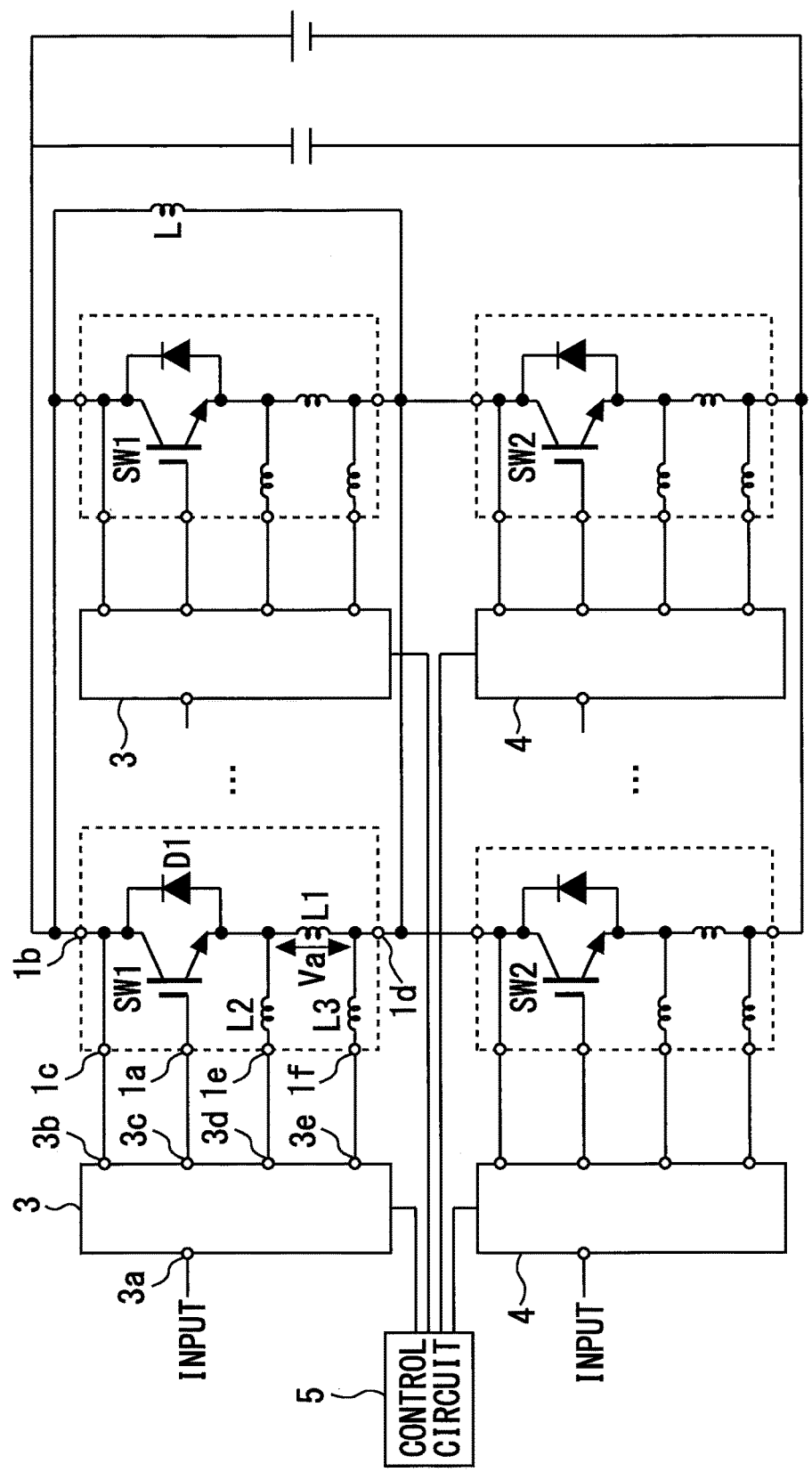
FIG. 1 is a diagram illustrating a gate driving circuit according to Embodiment 1 of the present invention.

FIG. 1 is a diagram illustrating a gate driving circuit according to Embodiment 1 of the present invention. Semiconductor switching devices SW1 and SW2 used for power conversion or control are connected in series to each other. A plurality of pairs of these semiconductor switching devices SW1 and SW2 are connected in parallel. A plurality of gate driver units 3, 4 respectively drive the plurality of semiconductor switching devices SW1, SW2 connected in parallel. An inductance L is a load inductance in the occasion when the semiconductor switching devices SW1, SW2 perform switching. A control circuit 5 controls the plurality of gate driver units 3 and 4.

A diode D1 is connected to the semiconductor switching device SW1 in anti-parallel. A gate electrode 1a is connected to the gate of the semiconductor switching device SW1. A collector electrode 1b and a collector auxiliary electrode 1c are connected to the collector of the semiconductor switching device SW1. The collector electrode 1b and an emitter electrode 1d are used when a main current is caused to flow in the parallel circuit. A wiring inductance between the emitter of the semiconductor switching device SW1 and the emitter electrode 1d is L1. A wiring inductance between the emitter of the semiconductor switching device SW1 and an emitter auxiliary electrode 1e is L2. A wiring inductance between the emitter electrode 1d and an emitter auxiliary electrode 1f is L3. The configuration of the semiconductor switching device SW2 side is also the same.

From an input electrode 3a, a signal is input to the gate driver unit 3. Electrodes 3b, 3c, 3d and 3e of the gate driver unit 3 are connected to the collector auxiliary electrode 1c, the gate electrode 1a, the emitter auxiliary electrode 1e and the emitter auxiliary electrode 1f of the semiconductor switching device SW1, respectively.

Figure 2:
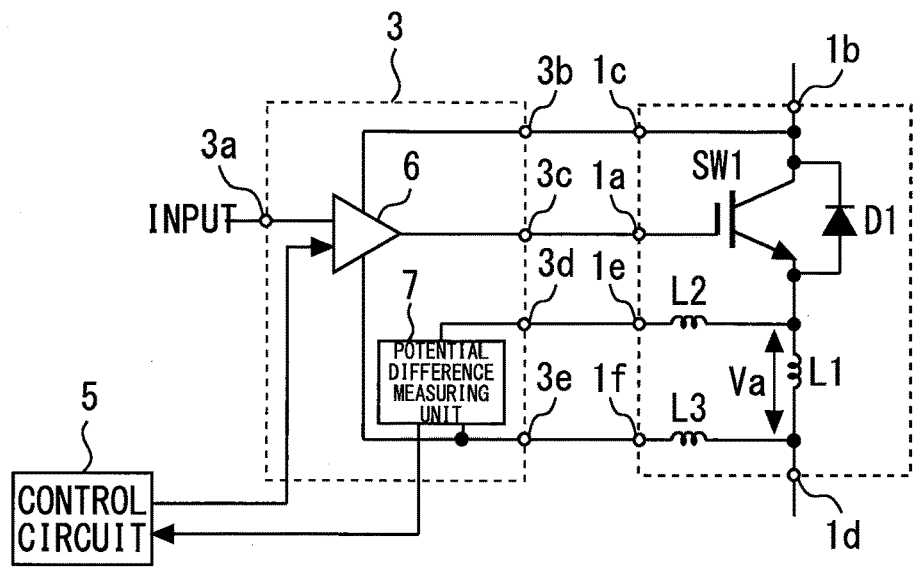
FIG. 2 is a partially expanded view of FIG. 1.

FIG. 2 is a partially expanded view of FIG. 1. The gate driver unit 3 has a gate driver 6 and a potential difference measuring unit 7. The gate driver 6 supplies a gate voltage to the gate of the corresponding semiconductor switching device SW1. The potential difference measuring unit 7 measures a potential difference Va arising due to the wiring inductance existing between the emitter auxiliary electrodes 1e and 1f on the emitter side of the corresponding semiconductor switching device SW1 for each cycle of an output frequency. The configuration of the gate driver unit 4 is also the same.

Based on the relation of L=V*di/dt, by monitoring the potential difference Va arising due to a current flowing via the inductance L1, dispersion of di/dt of the devices in turn-on or turn-off switching operation can be accurately monitored.

The control circuit 5 adjusts a gate voltage VGE supplied by the gate driver 6 of each gate driver unit 3 and 4 such that the potential differences Va of the plurality of semiconductor switching devices SW1 and SW2 in turn-on switching operation become same as each other. The control circuit 5 is realized by a processing circuit such as a CPU or a system LSI executing a program stored in a memory. Moreover, a plurality of processing circuits may perform the aforementioned function in cooperation.

As described above, in the present embodiment, the gate voltages supplied by the gate drivers of the gate driver units 3 and 4 are adjusted such that the potential differences Va arising due to the wiring inductances L1 on the emitter sides of the plurality of semiconductor switching devices SW1 and SW2 in turn-on switching operation become same as each other. Thereby, since di/dt of the semiconductor switching devices SW1 and SW2 can be matched to one another, current imbalance in parallel connection operation can be suppressed, and dispersion of switching losses can be suppressed.

Moreover, the control circuit 5 may adjust the gate voltages VGE supplied by the gate drivers 6 of the gate driver units 3 and 4 such that the potential differences Va of the plurality of semiconductor switching devices SW1 and SW2 in turn-off switching operation, not in turn-on one, become same as each other. Also in this case, the aforementioned effect can be obtained.

Moreover, the control circuit 5 may adjust the gate voltages supplied by the gate drivers 6 of the gate driver units 3 and 4 such that timings when the potential differences Va of the plurality of semiconductor switching devices SW1 and SW2 arise become same as each other. Thereby, since turn-on or turn-off timings of the semiconductor switching devices can be matched to one another, dispersion of switching losses can be suppressed.

Embodiment 2

Figure 3:
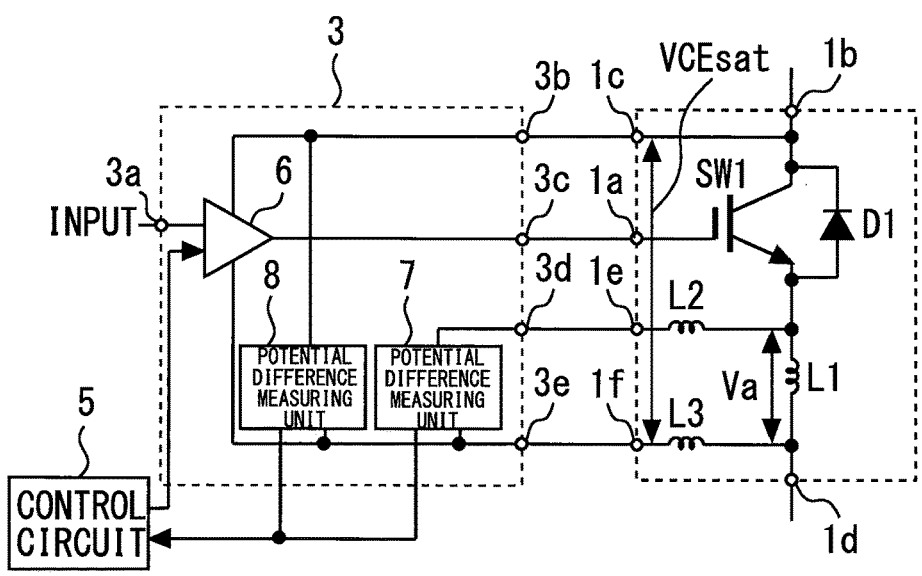
FIG. 3 is a partially expanded view of a gate driving circuit according to Embodiment 2 of the present invention.
Figure 4:
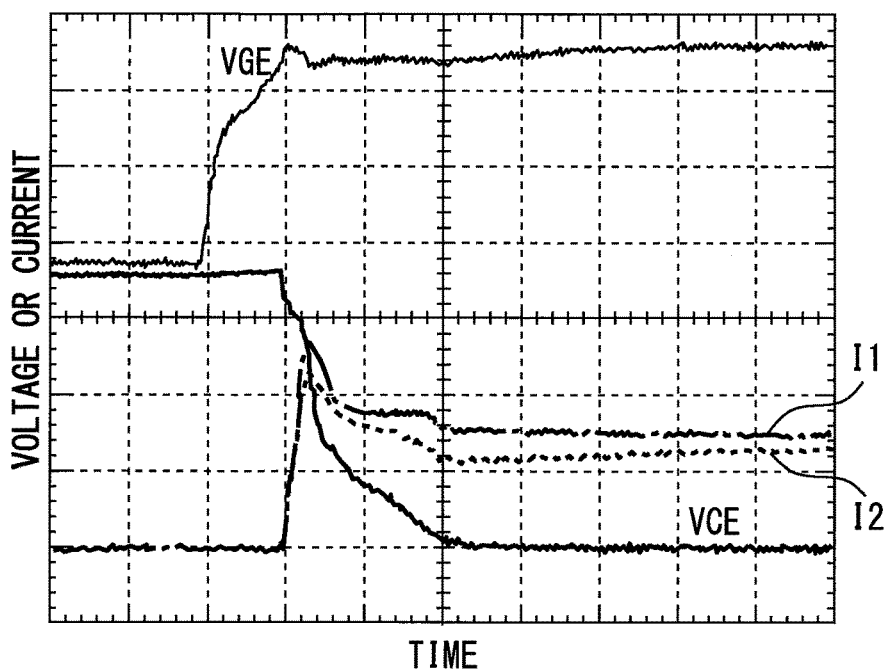
FIG. 4 is a diagram illustrating turn-on switching waveforms of two semiconductor switching devices connected in parallel.
Figure 5:
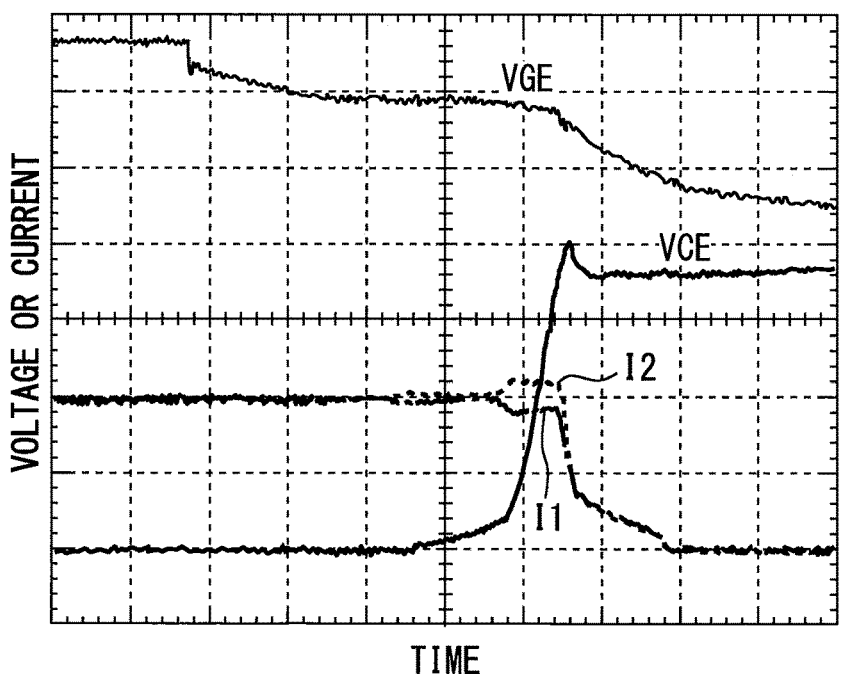
FIG. 5 is a diagram illustrating turn-off switching waveforms of two semiconductor switching devices connected in parallel.

FIG. 3 is a partially expanded view of a gate driving circuit according to Embodiment 2 of the present invention. The gate driver unit 3 further has a collector-emitter potential difference measuring unit 8 which measures a collector-emitter voltage VCEsat which is a voltage between the collector auxiliary electrode 1c and the emitter auxiliary electrode 1f of the corresponding semiconductor switching device SW1, for each cycle of the output frequency. The configuration of the gate driver unit 4 is also the same.

The control circuit 5 adjusts the gate voltages VGE supplied by the gate drivers 6 of the gate driver units 3 and 4 such that the collector-emitter voltages VCEsat of the plurality of semiconductor switching devices SW1 and SW2 during being steadily on become same as each other. Thereby, dispersion of losses during being steadily on can be suppressed.

In Embodiments 1 and 2, the plurality of semiconductor switching devices SW1 and SW2 are Si-transistors, Si-MOSFETs or Si-IGBTs. The plurality of semiconductor switching devices SW1 and SW2 are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST

SW1,SW2 semiconductor switching device; 3,4 gate driver unit; 5 control circuit; 6 gate driver; 7 potential difference measuring unit; 8 collector-emitter potential difference measuring unit

The invention claimed is:
1. A gate driving circuit comprising:
a plurality of gate driver units respectively driving a plurality of semiconductor switching devices connected in parallel; and
a control circuit controlling the plurality of gate driver units,
wherein each gate driver unit includes a gate driver supplying a gate voltage to a gate of the corresponding semiconductor switching device, and a potential difference measuring unit measuring a potential difference arising due to wiring inductance on an emitter side of the corresponding semiconductor switching device for each cycle of an output frequency, and
the control circuit adjusts the gate voltage supplied by the gate driver of each gate driver unit such that the potential differences of the plurality of semiconductor switching devices in turn-on or turn-off switching operation become same as each other.
2. The gate driving circuit according to claim 1, wherein the control circuit adjusts the gate voltage supplied by the gate driver of each gate driver unit such that timings when the potential differences of the plurality of semiconductor switching devices arise become same as each other.
3. The gate driving circuit according to claim 1, wherein each gate driver unit further includes a collector-emitter potential difference measuring unit which measures a collector-emitter voltage of the corresponding semiconductor switching device for each cycle of the output frequency, and the control circuit adjusts the gate voltage supplied by the gate driver of each gate driver unit such that the collector-emitter voltages of the plurality of semiconductor switching devices during being steadily on become same as each other.

4. The gate driving circuit according to claim 1, wherein the plurality of semiconductor switching devices are Si-transistors, Si-MOSFETs or Si-IGBTs.

5. The gate driving circuit according to claim 1, wherein the plurality of semiconductor switching devices are made of a wide-band-gap semiconductor.

6. The gate driving circuit according to claim 2, wherein each gate driver unit further includes a collector-emitter potential difference measuring unit which measures a collector-emitter voltage of the corresponding semiconductor switching device for each cycle of the output frequency, and
the control circuit adjusts the gate voltage supplied by the gate driver of each gate driver unit such that the collector-emitter voltages of the plurality of semiconductor switching devices during being steadily on become same as each other.

7. The gate driving circuit according to claim 2, wherein the plurality of semiconductor switching devices are Si-transistors, Si-MOSFETs or Si-IGBTs.

8. The gate driving circuit according to claim 3, wherein the plurality of semiconductor switching devices are Si-transistors, Si-MOSFETs or Si-IGBTs.

9. The gate driving circuit according to claim 6, wherein the plurality of semiconductor switching devices are Si-transistors, Si-MOSFETs or Si-IGBTs.

10. The gate driving circuit according to claim 2, wherein the plurality of semiconductor switching devices are made of a wide-band-gap semiconductor.

11. The gate driving circuit according to claim 3, wherein the plurality of semiconductor switching devices are made of a wide-band-gap semiconductor.

12. The gate driving circuit according to claim 6, wherein the plurality of semiconductor switching devices are made of a wide-band-gap semiconductor.

* * * * *